United States Patent
Heuer et al.

(10) Patent No.: US 8,117,236 B2
(45) Date of Patent: *Feb. 14, 2012

(54) CODING POSITIONS OF DATA ELEMENTS IN A DATA STRUCTURE

(75) Inventors: Jörg Heuer, München (DE); Andreas Hutter, München (DE)

(73) Assignee: Siemens Aktiengesellschaft, Munich (DE)

( * ) Notice: Subject to any disclaimer, the term of this patent is extended or adjusted under 35 U.S.C. 154(b) by 248 days.

This patent is subject to a terminal disclaimer.

(21) Appl. No.: 12/480,397

(22) Filed: Jun. 8, 2009

(65) Prior Publication Data

US 2009/0307243 A1 Dec. 10, 2009

Related U.S. Application Data

(63) Continuation of application No. 10/521,620, filed on Jan. 14, 2005, now Pat. No. 7,546,303, which is a continuation of application No. PCT/DE03/02168, filed on Jun. 30, 2003.

(30) Foreign Application Priority Data

Jul. 15, 2002 (DE) .................................. 102 31 970

(51) Int. Cl.
*G06F 17/30* (2006.01)
(52) U.S. Cl. ....................................................... 707/802
(58) Field of Classification Search .................. 707/713, 707/803, 802
See application file for complete search history.

(56) References Cited

U.S. PATENT DOCUMENTS

| 4,751,684 | A | 6/1988 | Holt | 365/231 |
|---|---|---|---|---|
| 7,051,247 | B2 | 5/2006 | Kikuchi et al. | 714/701 |
| 7,233,953 | B2 | 6/2007 | Heuer et al. | 707/100 |
| 7,546,303 | B2 * | 6/2009 | Heuer et al. | 1/1 |
| 2005/0204265 | A1 | 9/2005 | Lapstun et al. | 714/758 |
| 2006/0089937 | A1 | 4/2006 | Heuer et al. | 1/1 |

FOREIGN PATENT DOCUMENTS

DE 3688640 T2 6/1993

(Continued)

OTHER PUBLICATIONS

"Text of ISO/IEC FCD 15938-1 2001(E) Information technology—Mulitmedia content description interface—Part 1 Systems", XP001001465.

(Continued)

*Primary Examiner* — Cheryl Lewis
(74) *Attorney, Agent, or Firm* — King & Spalding L.L.P.

(57) ABSTRACT

The present invention relates to a method for coding positions of data elements in a data structure. According to the method, position codes are associated with the data elements in a pre-determined sequence, the position codes being selected in such a way that, if the lengths of the position codes are unlimited, many other position codes can be arbitrarily allocated between the positions of two data elements in order to code positions of other data elements. The present invention also relates to a method for coding positions of data elements in a data structure, whereby position codes are associated with the data elements in a pre-determined sequence, the position codes being selected in such a way that other position codes can be allocated between the positions of two adjacent data elements in order to code positions of other data elements, at least one other position code being longer than the longest position codes of the two adjacent data elements.

1 Claim, 2 Drawing Sheets

FOREIGN PATENT DOCUMENTS

WO 2004/017523 A1 2/2004

OTHER PUBLICATIONS

John J. Proakis, Digital communications, 2nd edition, XP002259086.

Shu-Yao Chien et al.: "Storing and Querying Multiversion XML Documents Using Durable Node Numbers" Web Information Systems Engineering, 2001. Proeceedings of the Second I International Conference on, Piscataway, NJ, USA, IEEE, Bd. 1.3. Dec. 2001, Seiten 232-242, XP002573315(10 pages).

* cited by examiner

CODING POSITIONS OF DATA ELEMENTS IN A DATA STRUCTURE

CROSS-REFERENCE TO RELATED APPLICATIONS

This application is a Continuation of U.S. patent application Ser. No. 10/521,620 filed Jan. 14, 2005, now U.S. Pat. No. 7,546,303, which is a continuation of co-pending International Application No. PCT/DE2003/002168 filed Jun. 30, 2003, which claims the benefit of German Patent Application No. 102 31 970.7 filed Jul. 15, 2002. The contents of which are hereby incorporated by reference in their entirety.

BACKGROUND OF THE INVENTION

Data structures frequently contain data elements which are to be differentiated by their positions with respect to each other. Position coding methods make this possible by allocating position codes to all data elements in a predetermined sequence.

A position coding method is described in [1] which is employed in a method for binary coding of XML data. This method uses XML schema definitions (in the context of a standardized MPEG-7 method, for example) in order to generate the codes for the individual data elements of the XML description. In this respect, individual elements or element groups of the same type as defined by the XML schema definition can occur several times in the document. In this case, a position code (PC) is transmitted. The position code includes the binary representation of a whole number which specifies the position with regard to the adjacent elements. The position code is associated with the element on the basis of the position with respect to the adjacent elements in the document to be coded. This has the advantage that the position code of an element is preserved irrespective of the sequence in which adjacent elements are transmitted. Elements, therefore, can be lost in transmission without this affecting the position codes or the position of the elements which are subsequently decoded via a decoder.

A disadvantage of this known method is that the XML document must be known at the time of coding since no new positions can be inserted with the previously existing position coding; instead, new positions can just be appended. This is a disadvantage especially when an XML document is already to be coded or transmitted while it is being created; for example, in live transmissions according to a transmission standard, such as MPEG-4 or MPEG-7.

For the purposes of solving this problem, gaps can be left between the position codes used, which can be filled when needed. Particularly in the case of live coding, however, the need-based readiness of such gaps which must be defined in advance is difficult to predict. Additionally, the overall quantity of possible gaps is limited by the XML schema definition in many cases. Then, if no more position codes kept free by such gaps are available at the position to be inserted, all the adjacent elements already sent have to be transmitted again with newly generated position codes. This frequently occurs in the case of a number of data elements of the same type; for example, in the case of identical elements or element groups occurring several times in a document. The consequence is a marked deterioration in coding efficiency and also a markedly increased processing overhead both at the coder and at the decoder.

The present invention is therefore directed toward a method and a device for coding positions of data elements in a data structure in which the positions of newly added data elements can be coded in a simple and efficient manner.

SUMMARY OF THE INVENTION

The method according to the present invention has the advantage that the position coding is robust with respect to data loss since position codes are retained. At the same time, where the method is used for coding XML documents, dynamic documents which are generated during the coding process can be coded efficiently. This is made possible by the fact that new positions can be coded between existing positions without elements and their position codes having to be transmitted again.

Additional features and advantages of the present invention are described in, and will be apparent from, the following Detailed Description of the Invention and the Figures.

DETAILED DESCRIPTION OF THE INVENTION

In the embodiment of the present invention considered in the following, position codes are associated with the data elements of the data structure in ascending order of the data element positions, which position codes also include rational numbers in a predetermined value range arranged in ascending order. Then, if a position between two existing positions is to be addressed, this is always possible since an infinitesimal quantity of rational numbers always exists between two given rational numbers R1 and R2 where R1≠R2. In real implementations, this quantity is admittedly not infinitesimal, but always may be selected sufficiently large; for example, >1024.If the position code of the first data element is not equal to zero, data elements whose position code is smaller than the position code of the first data element also may be inserted.

The use of rational numbers has the further advantage that it enables the shortest possible binary representation.

Figure 1:
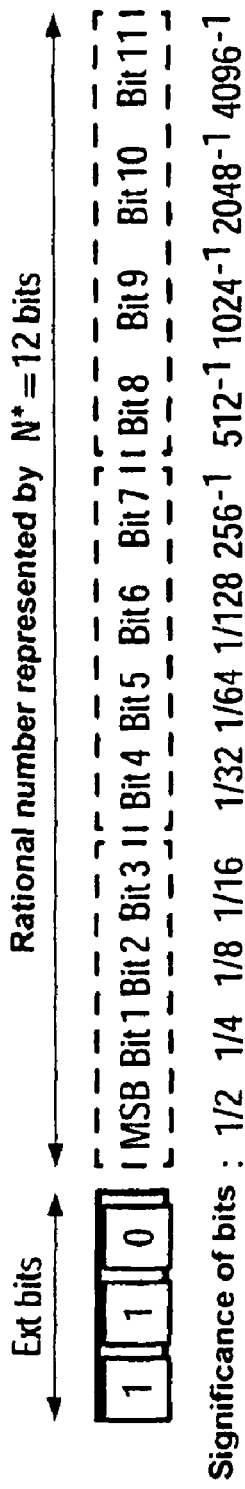
FIG. 1 is a representation of a position code for a data element, where the position code has been generated with the aid of the method according to the present invention.

FIG. 1 shows a position code for a data element. This position code includes the binary representation of a rational number to the base 2 in the value range [0, 1]. The binary representation of the rational number includes N=15 bits, where N*=12 data bits are present (MSB bit, bit 1 to bit 11; N*<=N), being arranged in three quadruples. The significance of the data bits is stated under the bits in each case. The data bits are preceded by three extension bits, where the quantity of extension bits specifies the quantity of data bit quadruples present. The first two extension bits are set to one and the last extension bit is set to zero. Setting the last extension bit to zero indicates that the following bits constitute data bits. With the aid of the representation selected in FIG. 1, therefore, a rational number is represented by N bits, of which N* bits include data bits, where N*<=N and N*=4k (in this respect, k includes a whole number in the value range [1, α]).

Figure 2:
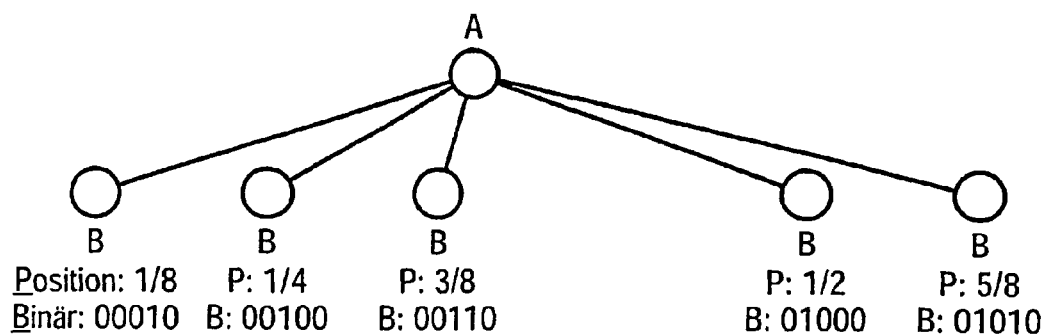
FIG. 2 shows a data structure where position codes are associated with the data elements, which position codes have been generated with the aid of the method according to the present invention.

FIG. 2 shows a data structure in the form of a data tree, where the position codes of the data elements have been generated with the aid of the inventive method described above. The data structure includes a data element A which is linked to five data elements B. Position codes P are associated with the data elements B in ascending order in the form of rational numbers 1/8, 1/4, 3/8, 1/2 and 5/8. Furthermore, the binary representations of the position codes are specified as shown in the diagram in FIG. 1.

Figure 3:
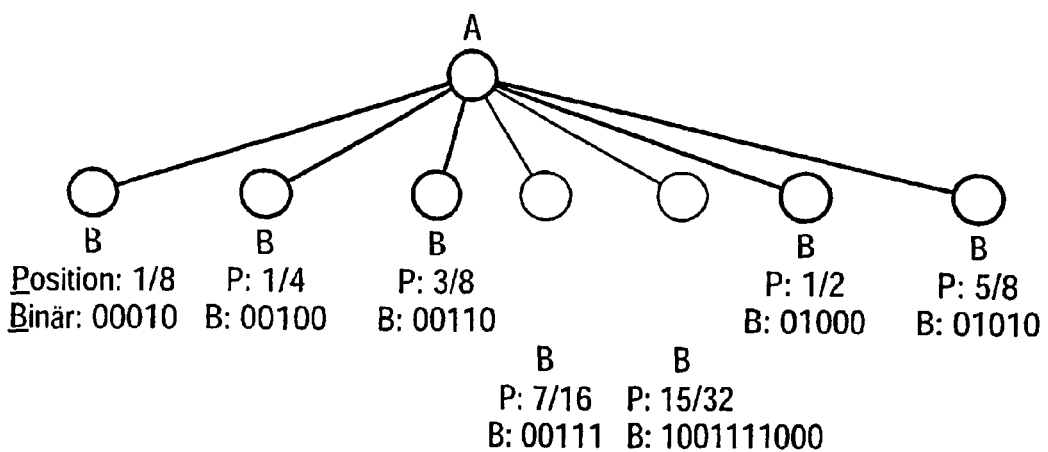
FIG. 3 shows the data structure of FIG. 2, where two new data elements have been added.

FIG. 3 shows a data structure in accordance with FIG. 2, where two more new data elements have been inserted between the data element with the position code 3/8 and the data element with the position code 1/2. These newly added data elements are shown in gray in FIG. 3, As a result of the use of rational numbers for the position codes, two values now may be found for the position codes of the new data elements which lie between the values 3/8 and 1/2. The numbers 7/16 and 15/32 have been selected for these values in FIG. 3. It is therefore possible to generate new position codes for new data elements in the data structure without the existing position codes having to be changed. Associated position codes, therefore may be retained and any desired number of new data elements inserted at any desired position.

Although the present invention has been described with reference to specific embodiments, those of skill in the art will recognize that changes may be made thereto without departing from the spirit and scope of the present invention as set forth in the hereafter appended claims.

REFERENCES

[1] ISO/IEC 15938-1 Multimedia Content Description Interface-Part 1: Systems, Geneva 2002

What is claimed is:

1. A device for coding positions of data elements in a data structure of a document and for transmitting said document, comprising:
   means for coding and transmitting said document, wherein said means are operable to:
      associate position codes with the data elements in a predetermined sequence, wherein the position codes are represented as rational numbers; and
      select the position codes such that, if lengths of the position codes are unlimited, any desired number of new position codes may be allocated as positions for new data elements that are to be inserted between positions of two data elements in order to code positions of the new data elements within the data structure without changing the associated position codes.

\* \* \* \* \*